(12) United States Patent
Stamper et al.

(10) Patent No.: US 11,637,068 B2
(45) Date of Patent: Apr. 25, 2023

(54) THERMALLY AND ELECTRICALLY CONDUCTIVE INTERCONNECTS

(71) Applicant: GLOBALFOUNDRIES U.S. Inc., Santa Clara, CA (US)

(72) Inventors: Anthony K. Stamper, Burlington, VT (US); Vibhor Jain, Williston, VT (US); Steven M. Shank, Jericho, VT (US); John J. Ellis-Monaghan, Grand Isle, VT (US); John J. Pekarik, Underhill, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/121,810

(22) Filed: Dec. 15, 2020

(65) Prior Publication Data

US 2022/0189877 A1 Jun. 16, 2022

(51) Int. Cl.
*H01L 23/522* (2006.01)
*H01L 23/532* (2006.01)
(Continued)

(52) U.S. Cl.
CPC .... *H01L 23/5329* (2013.01); *H01L 21/76802* (2013.01); *H01L 21/76898* (2013.01);
(Continued)

(58) Field of Classification Search
CPC ....... H01L 23/00; H01L 23/48; H01L 23/532; H01L 23/373; H01L 23/522;
(Continued)

(56) References Cited

U.S. PATENT DOCUMENTS

| 5,897,924 A | 4/1999 | Ulczynski et al. |
| 7,943,428 B2 | 5/2011 | Gambino et al. |

(Continued)

FOREIGN PATENT DOCUMENTS

EP 2778263 A2 9/2014

OTHER PUBLICATIONS

Ding et al., "Reactive Ion Etching of CVD Diamond Films for MEMS Applications", Micromachining and Microfabrication, Proceedings of SPIE, vol. 4230, 2000, pp. 223-230.

(Continued)

*Primary Examiner* — Chuong A Luu
(74) *Attorney, Agent, or Firm* — Anthony Canale; Hoffman Warnick LLC

(57) ABSTRACT

Processing forms an integrated circuit structure having first and second layers on opposite sides of an insulator, and an interconnect structure extending through the insulator between the first layer and the second layer. The interconnect structure is formed in an opening extending through the insulator between the first layer and the second layer and has an electrical conductor in the opening extending between the first layer and the second layer and a thermally conductive electrical insulator liner along sidewalls of the opening extending between the first layer and the second layer. The electrical conductor is positioned to conduct electrical signals between the first layer and the second layer, and the thermally conductive electrical insulator liner is positioned to transfer heat between the first layer and the second layer.

14 Claims, 8 Drawing Sheets

(51) Int. Cl.
*H01L 21/768* (2006.01)
*H01L 23/00* (2006.01)
*H01L 23/373* (2006.01)
*H01L 23/48* (2006.01)
*H01L 27/06* (2006.01)

(52) U.S. Cl.
CPC ........ *H01L 23/3732* (2013.01); *H01L 23/481* (2013.01); *H01L 23/5226* (2013.01); *H01L 24/11* (2013.01); *H01L 24/13* (2013.01); *H01L 23/53214* (2013.01); *H01L 23/53228* (2013.01); *H01L 23/53257* (2013.01); *H01L 27/0623* (2013.01); *H01L 2224/10122* (2013.01); *H01L 2224/11011* (2013.01); *H01L 2224/13009* (2013.01)

(58) Field of Classification Search
CPC ............. H01L 23/5329; H01L 23/3732; H01L 23/481; H01L 23/5226; H01L 23/53214; H01L 23/53228; H01L 23/53257; H01L 23/53223; H01L 23/53238; H01L 23/53252; H01L 23/53266; H01L 23/53276; H01L 21/768; H01L 21/76802; H01L 21/76898; H01L 24/11; H01L 24/13; H01L 2224/10122; H01L 2224/11011; H01L 2224/13009; H01L 27/146; H01L 27/14636; H01L 23/498; H01L 23/538; H01L 23/528; H01L 23/5386; H01L 23/49866; H01L 21/02; H01L 21/8234; H01L 21/8238; H01L 21/823475; H01L 21/823871; H01L 21/02362; H01L 21/76876; H01L 21/76841

USPC ........................................................ 257/506
See application file for complete search history.

(56) References Cited

U.S. PATENT DOCUMENTS

| | | | |
|---|---|---|---|
| 8,575,657 | B2 | 11/2013 | Gambin et al. |
| 8,881,379 | B2 | 11/2014 | Coolbaugh et al. |
| 9,196,703 | B2 | 11/2015 | Hobart et al. |
| 9,728,483 | B2 | 8/2017 | Maples et al. |
| 2005/0031785 | A1 | 2/2005 | Carlisle et al. |
| 2008/0200025 | A1* | 8/2008 | Ma .................... H01L 21/76808 257/E21.214 |
| 2013/0087756 | A1* | 4/2013 | Joseph ................ H01L 45/1683 257/E47.001 |
| 2013/0248879 | A1* | 9/2013 | Gambin .............. H01L 29/7786 257/77 |

OTHER PUBLICATIONS

Gautam et al., "A Comparison of Thermal Vias Patterns used for Thermal Management in Power Converter", IEEE, 2013, pp. 2214-2218.

Khan et al., "Targeted Cooling with CVD Diamond and Micro-Channel to Meet 3-D IC Heat Dissipation Challenge", IEEE, 2012, pp. 1-5.

Onkaraiah et al., "Mitigating Heat Dissipation and Thermo-Mechanical Stress Challenges in 3-D IC Using Thermal Through Silicon Via (TTSV)", IEEE, Electronic Components and Technology Conference, 2010, pp. 411-416.

Poust et al., "Selective Growth of Diamond in Thermal Vias for GaN HEMTs", IEEE, 2013, pp. 1-4.

* cited by examiner

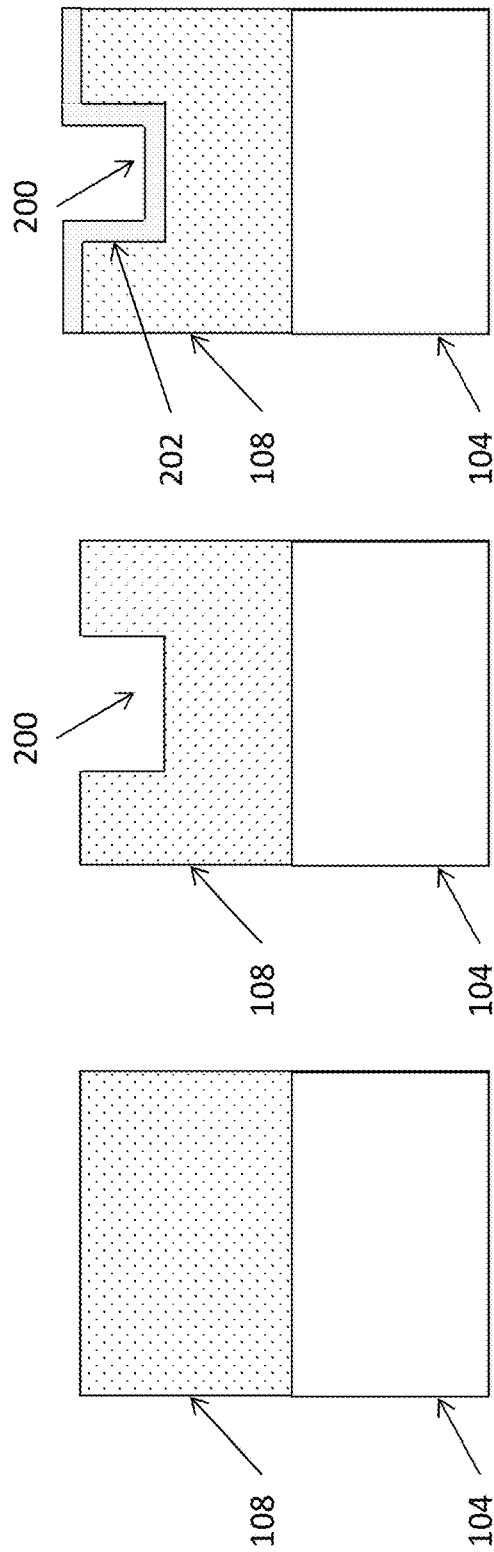
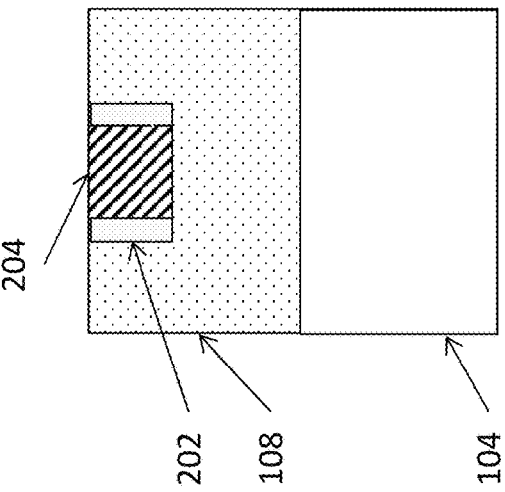
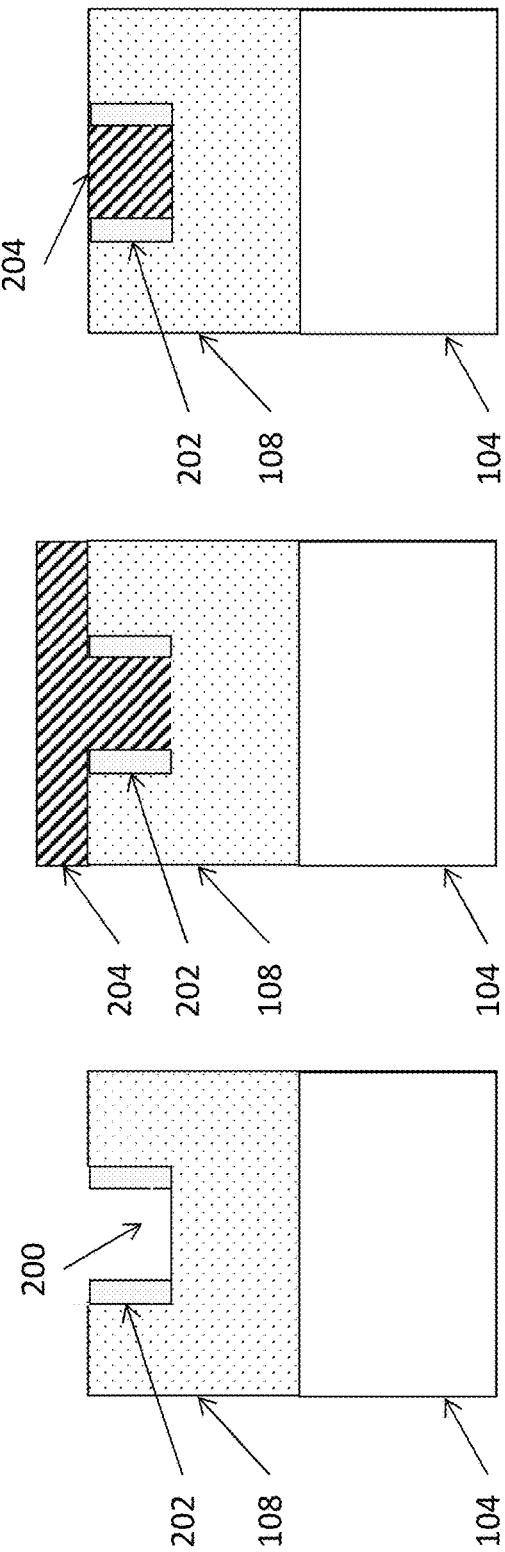

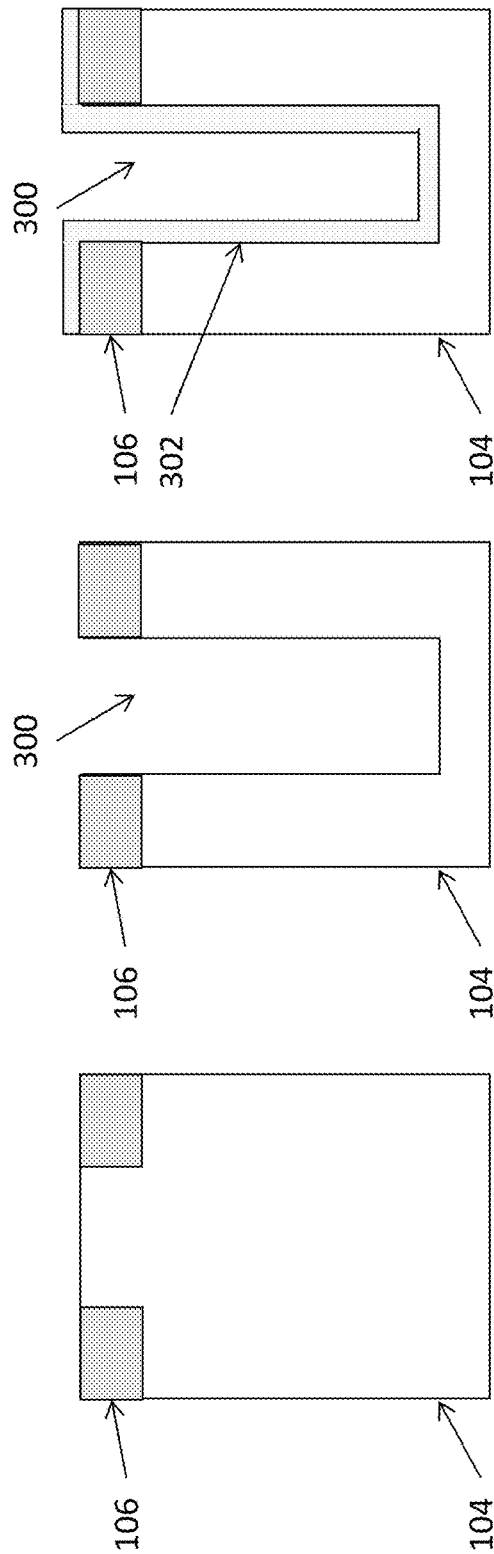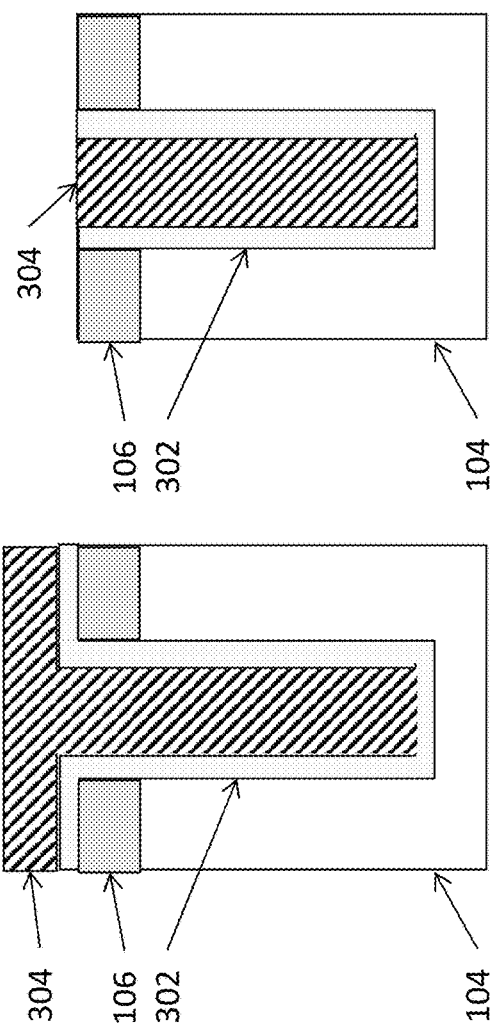

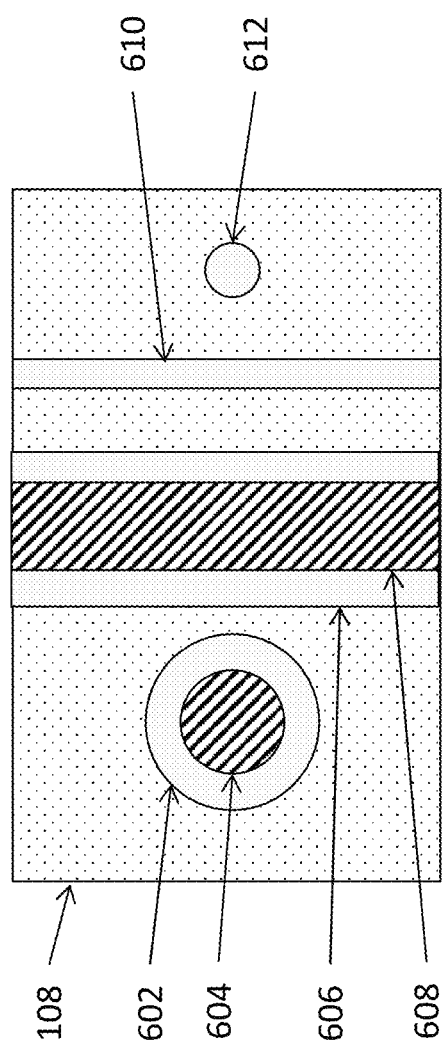

THERMALLY AND ELECTRICALLY CONDUCTIVE INTERCONNECTS

BACKGROUND

The present disclosure relates to integrated circuit structures, and more specifically to interconnects within multi-layer integrated circuit structures.

A sometimes undesirable product of integrated circuits (ICs) operations is heat, which (in sufficient quantities and durations) can detrimentally affect ICs performance and may even damage the components within ICs in extreme situations. Various efforts have been applied to reduce and remove heat from ICs and such efforts are bounded by size, performance, yield, and cost constraints.

SUMMARY

Integrated circuit structures have an electrical conductor in an opening of an insulator and a thermally conductive electrical insulator liner along sidewalls of the opening.

In greater detail, integrated circuit structures have an insulator layer, a first layer and a second layer on opposite sides of the insulator layer, and an interconnect structure extending through the insulator layer between the first layer and the second layer. The interconnect structure is in an opening extending through the insulator layer between the first layer and the second layer. The interconnect structure has an electrical conductor in the opening extending between the first layer and the second layer; and a thermally conductive electrical insulator liner along sidewalls of the opening extending between the first layer and the second layer. The electrical conductor is positioned to conduct electrical signals between the first layer and the second layer. The thermally conductive electrical insulator liner is positioned to transfer heat between the first layer and the second layer.

Methods form interconnect structures by forming an opening in an insulator of an integrated circuit structure, forming a thermally conductive electrical insulator liner along sidewalls of the opening, and forming an electrical conductor on the thermally conductive electrical insulator liner in the opening.

BRIEF DESCRIPTION OF THE DRAWINGS

The embodiments herein will be better understood from the following detailed description with reference to the drawings, which are not necessarily drawn to scale and in which:

FIGS. 2A-2F are a series of cross-sectional schematic diagrams illustrating processing steps performed by embodiments herein to produce the integrated circuit structures described herein;

FIGS. 3A-3E are a series of cross-sectional schematic diagrams illustrating processing steps performed by embodiments herein to produce the integrated circuit structures described herein;

FIG. 6 is a schematic diagram illustrating integrated circuit structures herein;

DETAILED DESCRIPTION

As mentioned above, various efforts have been applied to reduce and remove heat from ICs and such efforts are bounded by size, performance, yield, and cost constraints. For example, dedicated heat dissipation structures (those structures who's only function is to remove heat) can be formed within and on the exterior of ICs. Such heat dissipation structures are usually formed of a highly thermally conductive material, such as metals, diamond, etc. However, utilization of these dedicated heat dissipation structures consumes valuable space (e.g., "real estate") of the interior and/or exterior of the ICs, which makes the ICs larger and more expensive than they would be without such heat dissipation structures. Compounding such issues is that fact that thermal conductors can also be electrically conductive, requiring that any heat dissipation structure be well insulated from electrical conductors to prevent unwanted short circuits. Therefore, IC designers are often burdened with balancing size and cost against heat dissipation, which can result in a less than optimum final product. The systems and methods herein address these issues by providing interconnects that are both highly thermally and electrically conductive.

Figure 1:
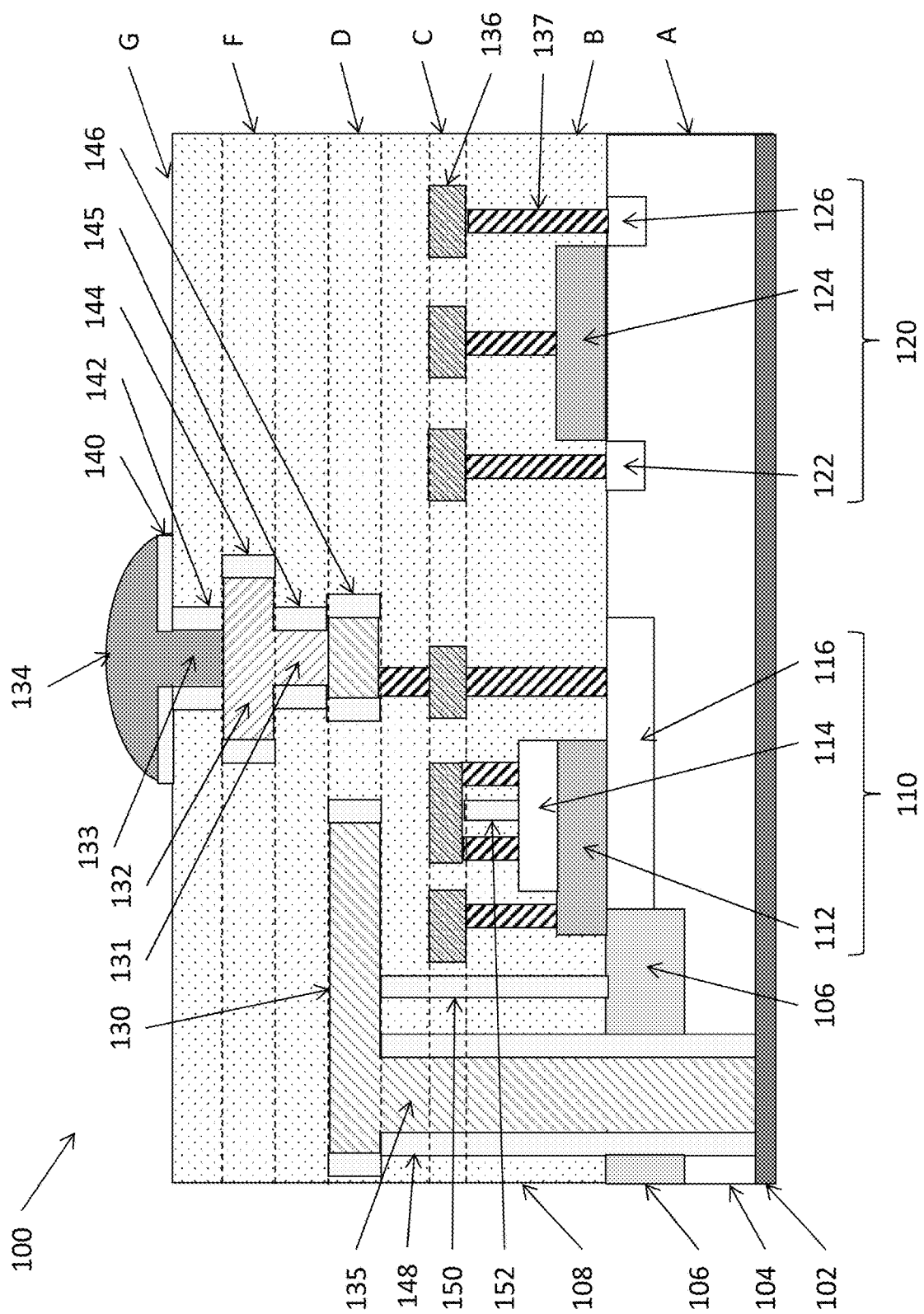
FIG. 1 is a cross-sectional schematic diagram illustrating integrated circuit structures herein.

FIG. 1 is a cross-section of an exemplary multi-layer integrated circuit (IC) structure 100 having many features that are discussed in detail below. Note that FIG. 1 includes multiple novel structures disclosed herein, some of which may or may not be mutually exclusive to each other; however, such structures are shown together in a single drawing to reduce the number and complexity of the drawings accompanying this description.

Generally, FIG. 1 is a cross-sectional view relative to (perpendicular to) a planar exterior surface G that contains an exterior conductive bump 134, such as a solder bump, copper pillar, or other external chip contact, which provides electrical connections to internal components. Additionally, the IC structure 100 is a multi-layer structure having various internal layers such as a substrate layer A, an active device layer B, and various wiring layers C-F separated by a non-conductive insulator material 108.

Further, an optional layer 102 (e.g., conductor or insulator) is under the substrate 104 and various active devices (e.g., bipolar transistor 110, field effect transistor 120, etc.) can be formed on and in the substrate 104. For example, layer 102 could be a conductor that touches the bottom conductor of a through silicon via (TSV) 135. For example, the bipolar junction transistor (BJT) or heterojunction transistor (HBT) 110 generally include a base 112, emitter 114, and collector 116, and transistors 120 generally include source 122, gate 124, and drain 126. These elements of the BJT or HVT transistor 110 and field effect transistors (FET) 120 are connected to various wiring layers, such as the M1 wiring layer (layer C), E1 wiring layer (layer D), and LM wiring layer (layer F) by various electrical contacts 137.

As can be seen in FIG. 1, various electrically conductive via structures 131, 133, 135, etc., extend (e.g., vertically) through the insulator 108 between the different layers B-G that contain electrical conductor wires 130 (e.g., E1 layer conductors), 132 (e.g., LM layer conductors), 134 (bump conductors), 136 (e.g., M1 layer conductors) which extend horizontally. The via structures 131, 133, 135, etc., electrically connect the wiring conductors 130, 132, 134, etc., in the various layers B-G. Note that the terms vertical and horizontal herein are arbitrary generic descriptions of directions that are perpendicular to one another and these terms do not denote specific orientations.

The vertical via structures 131, 133, 135, etc., are within an opening extending through the insulator layer 108 between adjacent layers (e.g., between first and second layers of layers B-G), and include an electrical conductor in the opening extending between the first and second layers.

Further, with structures herein, high thermal conductivity layers that are electrical insulators and can be, for example, diamond or similar materials, are referred to here as thermally conductive electrical insulator liners (or layers) 140, 142, 144, 145, 146, 148 and are along the contact bump 134 and sidewalls of the bump via 133, some or all of the wiring conductors 130, 132, 134, etc., and the via structures 131, 133, 135, etc. Thus, the thermally conductive electrical insulator layers 140, 142, 144, 145, 146, 148 line the openings within and extending between the various layers B-G. Thus, in some embodiments herein, the thermally conductive electrical insulator layers 140, 142, 144, 145, 146, 148 contact and are between the electrical conductors 130, 131, 132, 133, 134, 135 and the insulator 108. While the electrical conductors 130, 131, 132, 133, 134, 135, 136, 137 are positioned to conduct electrical signals between and within the various layers B-G, the thermally conductive electrical insulator layers 140, 142, 144, 145, 146, 148 are positioned to transfer heat between the various layers B-G. The thermally conductive electrical insulator layers 140, 142, 144, 145, 146, 148 and the electrical conductors 130, 131, 132, 133, 134, 135 fill the openings in the insulator 108 (and, in some embodiments herein, the thermally conductive electrical insulator layer occupies at least 20% of a volume of the opening).

In some embodiments herein shallow trench isolation (STI) structures 106 in the substrate 104 contact the insulator 108 and are used to electrically isolate adjacent devices. As shown in FIG. 1, a thermally conductive electrical insulator liner 148 can contact and be positioned between the electrically conductive via 135 and the STI structure 106.

The via structures herein can be, for example, a through silicon via (TSV) 135, electrically conductive wires 130, 132, 136, an external contact 134, an internal contact, inter-layer electrical vias 131, 133, 137, etc. The openings in which the thermally conductive electrical insulator liners/layers 140, 142, 144, 145, 146, 148 are formed can be linear, circular, etc. Additionally, stand-alone thermal conductor structures 150, 152, which are openings filled only with thermally conductive electrical insulator material can be formed at locations in structures where additional thermal conduction is desired. Note that such stand-alone thermal conductors do not occupy their own dedicated chip area, but instead only occupy areas where just the insulator 108 would be positioned. Thus, stand-alone thermal conductor 150 is positioned in a region of the insulator 108 where no other structures would be present. Similarly, stand-alone thermal conductor 152 is positioned between parallel redundant contacts (which redundantly provide an electrical connection between the same two items) and again occupies the same chip space that would otherwise have only been occupied by the insulator 108. Thermally conductive electrical insulator layer 152 can simultaneously be formed on via 137 sidewalls and between the vias 152 by patterning the vias 137 to be wide enough to include both thermally conductive electrical insulator and conductor; and thermal conductor 152 narrow enough to pinch off during thermally conductive electrical insulator deposition.

FIGS. 2A-2F show one example of damascene processing used to form the thermally conductive electrical insulator lined interconnects. Specifically, FIG. 2A shows the insulator 108 on the substrate 104. In FIG. 2B, a trench 200 is formed in the insulator 108 using conventional patterning and etching processing.

In FIG. 2C, the trench 200 is lined with thermally conductive electrical insulator material 202 using any conventional thin film deposition/growth technique, such as a diamond thin film. Conventional thin film deposition/growth methods for diamond thin films include a downstream microwave plasma chemical vapor deposition in the 350-450 C range using carbon precursors such as a carbon-rich gas mixture (usually of hydrogen and a perfluorocarbon such as methane (CH4)). In some embodiments herein, the thin film diamond deposition temperature can be controlled to be below 500 C to avoid damaging or melting the on-chip metals used for wiring and vias, such as aluminum and copper. Alternatively, the thin film diamond can be deposited using atomic layer deposition at temperatures below 500 C; or using any known method.

In FIG. 2D, a directional or spacer etching process (e.g., anisotropic) etches the thermally conductive electrical insulator material 202 from horizontal surfaces at a greater rate than it removes material from vertical surfaces, thereby leaving the thermally conductive electrical insulator material 202 along the vertical sidewalls of trench 200. In FIG. 2E, a conductor 204 is deposited using any conventional deposition/growth techniques and in FIG. 2F the excess material is removed from the surface of the insulator 108 in etching, polishing, etc., processing to leave the trench 200 lined with the thermally conductive electrical insulator material 202 and filled with the conductor 204.

FIGS. 3A-3E show one example of forming thermally conductive electrical insulator lined through silicon vias. More specifically, optional STI regions 106 in the substrate 104 are shown in FIG. 3A. In FIG. 3B, a trench 300 is formed in the substrate 104 using conventional patterning and etching processing. In FIG. 3C, the trench 300 is lined with thermally conductive electrical insulator material 302 using any conventional thin film deposition/growth technique. In FIG. 3D, a conductor 304 is deposited using any conventional deposition/growth techniques and in FIG. 3E the excess material is removed from the surface of the substrate 104 in etching, polishing, etc., processing to leave the trench 300 lined with the thermally conductive electrical insulator material 302 and filled with the conductor 304.

Figure 4B:
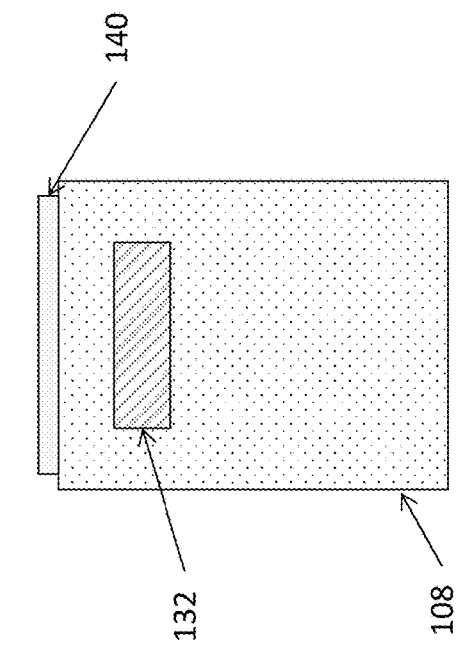
FIGS. 4A-4D are a series of cross-sectional schematic diagrams illustrating processing steps performed by embodiments herein to produce the integrated circuit structures described herein.
Figure 4D:
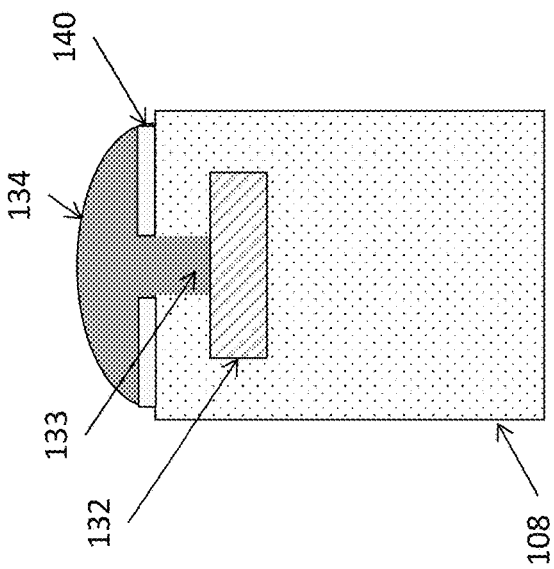
Figure 4A:
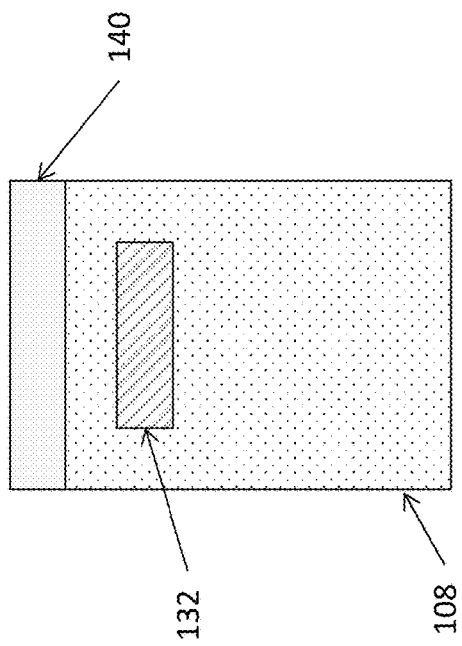
Figure 4C:
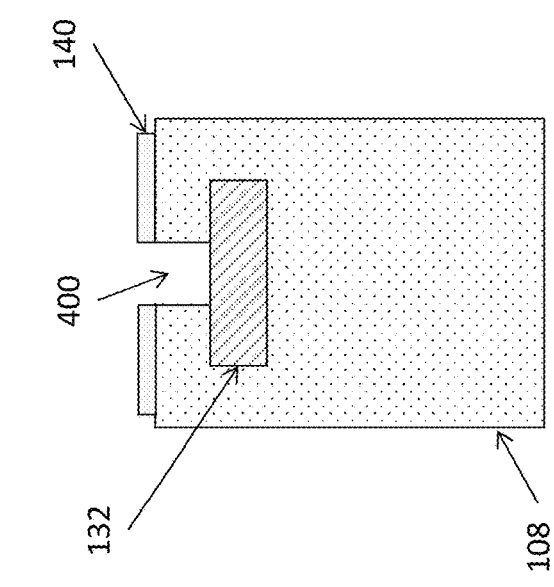

FIGS. 4A-4D shown one example of forming thermally conductive electrical insulator layers below a solder bump or copper pillar 133, 134. Specifically, FIG. 4A shows the LM wiring 132 within the insulator 108 with an overlying thermally conductive electrical insulator layer 140 formed thereon. In FIG. 4B the thermally conductive electrical insulator layer 140 is patterned and thinned using conventional patterning and material removal techniques. In FIG. 4C, a trench 400 is formed in the insulator 108 using conventional patterning and etching processing. In FIG. 4D, the trench 400 is overfilled with conductive material (e.g., solder, copper, etc.) so as to form a contact bump 134 and electrical via 133 to the LM wiring 132. As shown in FIG. 4D, this leaves the thermally conductive electrical insulator layer 140 between the outer surface of the insulator 108 and the contact bump 134, promoting thermal conduction between the two.

Another embodiment forms thermally conductive electrical insulator sidewall layers on via 400 (as shown in FIG. 2A-2D) before or after thermally conductive electrical insulator layer 140 is formed. This results in thermally conductive electrical insulator layers 142 on the sides of via 400 (and pillar 133) and under 140 the contact bump 134 (as shown in FIG. 1).

Figure 5B:
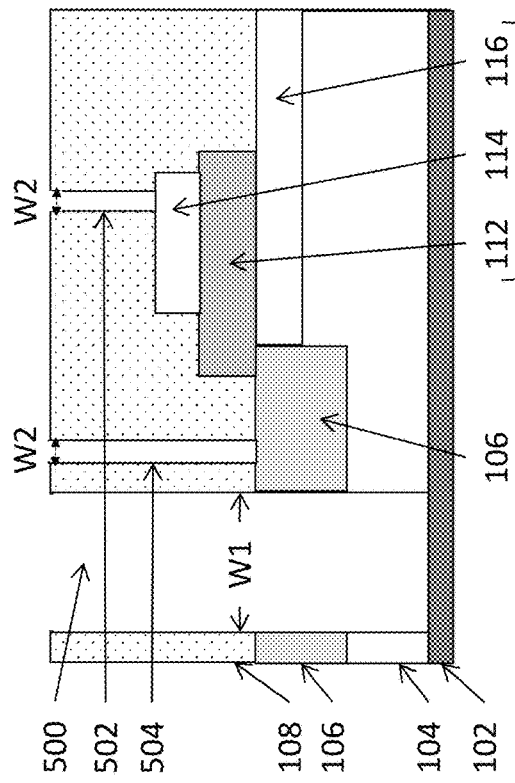
FIGS. 5A-5D are a series of cross-sectional schematic diagrams illustrating processing steps performed by embodiments herein to produce the integrated circuit structures described herein.
Figure 5D:
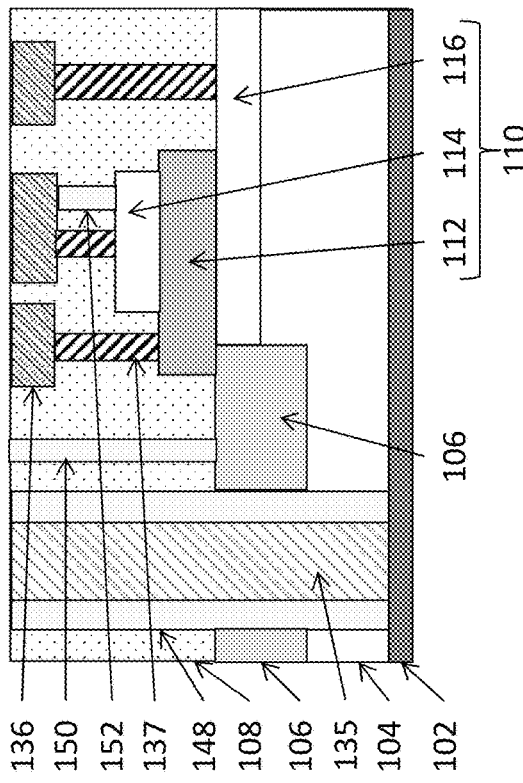
Figure 5A:
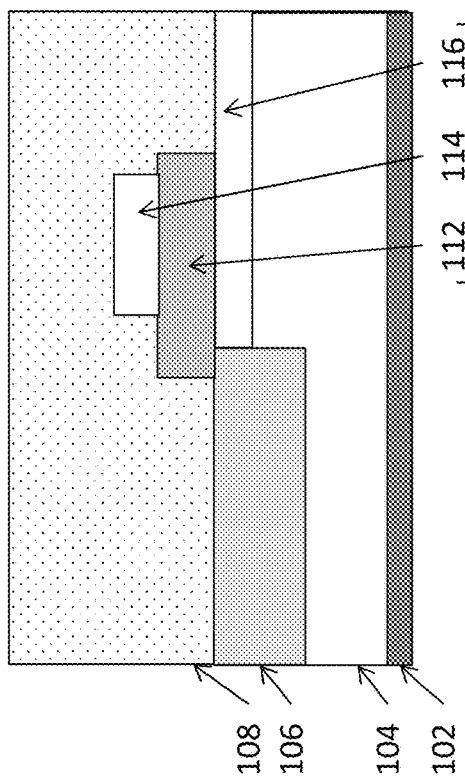

FIGS. 5A-5D illustrate various thermal structures included into standard processes of forming contacts to active devices, such as a bipolar transistor 110. Specifically, FIG. 5A shows a fully formed bipolar transistor 110 (having base 112, emitter 114, and collector 116 adjacent an STI region 106) in and on the substrate 104 and overlying insulator 108 before any contacts are formed. In FIG. 5B, various openings 500, 502, 504 are formed, potentially in multiple patterning processes. Note that, as shown in FIG. 5B, the openings formed are different sizes (different widths). For example, opening 500 has a wider width W1, while openings 502 and 504 have relatively narrower widths W2.

Figure 5C:
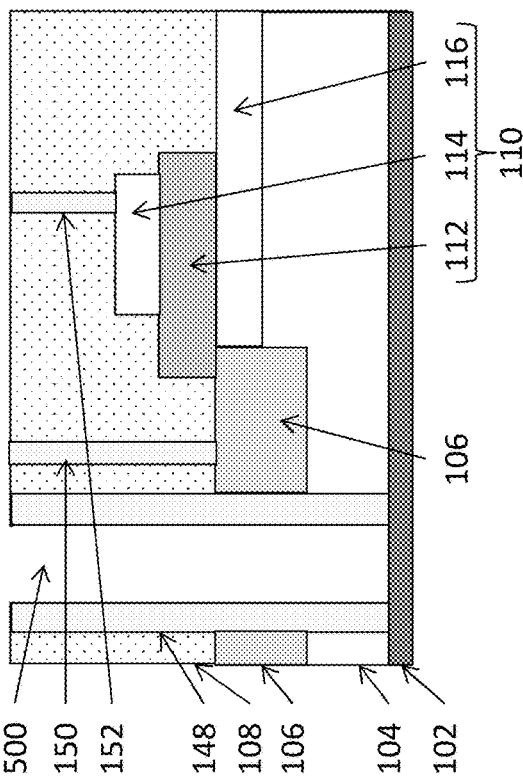

Thermally conductive electrical insulator material is deposited in the openings 500, 502, 504 and subsequently removed from horizontal surfaces (as discussed above) leaving the thermally conductive electrical insulator material 148 on the sidewalls of opening 500 and filling openings 502, 504 as thermal conductors 150, 152, as shown in FIG. 5C. Note that because of the different opening widths (W1, W2, shown in FIG. 5B) opening 500 is wide enough (W1) to not be filled with thermally conductive electrical insulator material but only be lined with thermally conductive electrical insulator material; however, openings 502, 504 are sufficiently narrow (W2) to be completely filled with thermally conductive electrical insulator material. As a result, the thermally conductive electrical insulator liner 148 only remains on the sidewalls of opening 500 because the horizontal bottom of the opening is large enough to be exposed to the etching, but the thermally conductive electrical insulator thermal conductor 150, 152 completely fills openings 502, 504 because the narrower width (W2) prevents the etching from removing the narrower material from the narrower openings 502, 504.

As shown in FIG. 5D, a TSV 135, tungsten contacts 137, and an overlying wiring layer (M1) are formed using conventional contact and wiring layer formation processes. Note that, as shown in FIG. 5D, the thermally conductive electrical insulator liner 148 of the TSV 135 allows this single interconnect structure to provide thermal and electrical connectivity. Further, in the same structure, the thermal conductors 150, 152 and separate electrical conductors 137 (that are formed in the same processing used to form the single interconnect structure 135, 148) allow separate structures to thermally and electrically conduct.

FIG. 6 is a top view of the insulator 108 showing that, in one example, the thermally conductive electrical insulator layer/liner 602 completely surrounds the inner conductor 604 formed in a hole. Note that while the inner conductor 604 and thermally conductive electrical insulator layer 602 are shown as circular in the top view of FIG. 6, these items could be rectangular or any shape that could be patterned on oxide layer 108. Additionally, the thermally conductive electrical insulator layer/liner 606 completely surrounds the inner conductor 608 formed in a trench. FIG. 6 also illustrates stand-alone thermal conductors, where one stand-alone thermal conductor 610 is formed in a trench, while another stand-alone thermal conductor 612 is formed in a hole.

Using diamond as an example of a thermally conductive electrical insulator, the diamond layer can occupy 20% or more of the cross-sectional volume of the opening. While diamond materials can have thermal conductivities of 5-40 times the thermal conductivity of metals such a tungsten, copper, aluminum, tin, etc.; diamond materials generally are not very electrically conductive. Therefore, a balance is made between increasing thermal conductivity of the interconnects and controlling a detrimental effect on electrical conductivity of the interconnects.

For example, copper TSVs that use a 40% diamond liner can see almost a 4× increase in thermal conductivity, without much loss in electrical conductivity; while tungsten TSVs that use a 40% diamond liner can see almost a 7× increase in thermal conductivity, also without much loss in electrical conductivity. In contrast, copper and aluminum-copper wiring (e.g., 5 um) that uses a 20% diamond liner can see almost a 3×-4× increase in thermal conductivity, without much loss in electrical conductivity; aluminum-copper alloy circular vias (e.g., 5 um) that use a 20% diamond liner can see over a 5× increase in thermal conductivity, without much loss in electrical conductivity; and tin wiring (e.g., 5 um) that uses a 20% diamond liner can see almost a 4× increase in thermal conductivity, without much loss in electrical conductivity. Copper pillars and tin solder bumps that use a 20% diamond liner can see a 3×-4× increase in thermal conductivity, without much loss in electrical conductivity. Therefore, structures herein use diamond layers that occupy 20%-40% of the cross-sectional volume of the opening to balance thermal and electrical conductivity.

Figure 7:
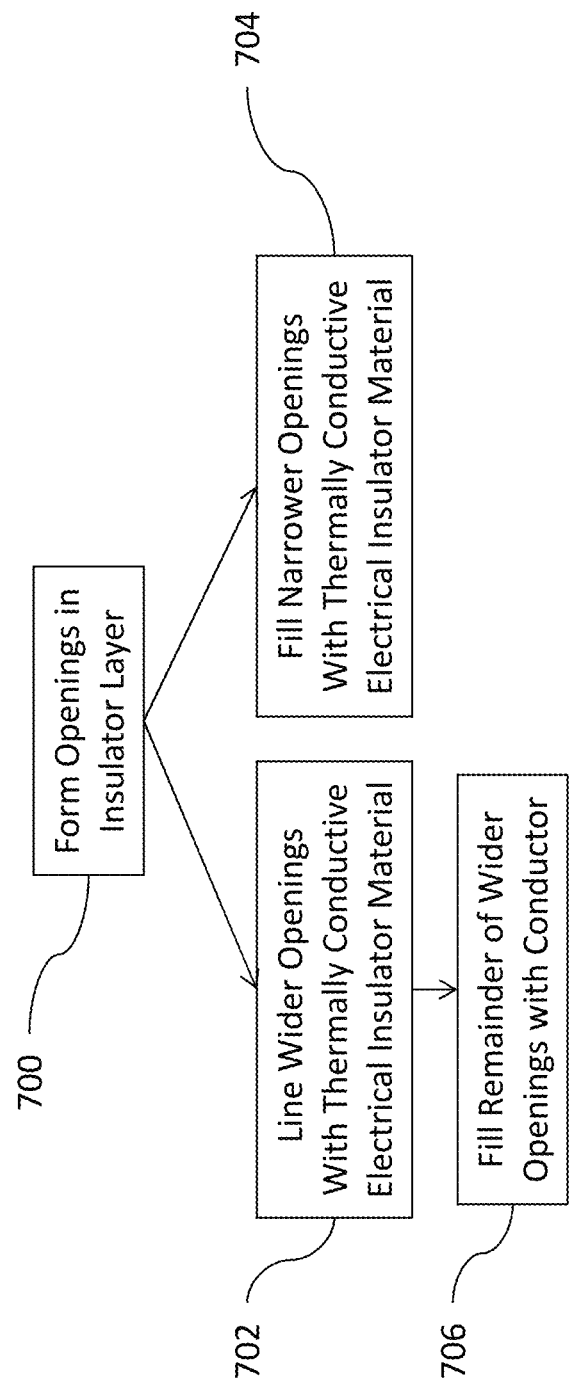
FIG. 7 is a flow diagram illustrating embodiments herein.

As shown in FIG. 7, various methods herein perform processing that forms an interconnect structure that has both high electrical conductivity and high thermal conductivity. In item 700, these methods form wide and narrow openings in an insulator layer of a multi-layer integrated circuit structure. Simultaneously in item 702 and 704, these methods then form a thermally conductive electrical insulator material along the sidewalls of the wider openings (702) and fill the narrower openings with the thermally conductive electrical insulator material (204), where the thermally conductive electrical insulator material is formed as a thermal conductor. In greater detail, the thermally conductive electrical insulator liner/layer is formed in item 702 to line the opening and leave a remainder of the opening unfilled and an electrical conductor is formed later to fill the remainder of the opening left unfilled by the thermally conductive electrical insulator layer. In item 706, these methods form the electrical conductor on the thermally conductive electrical insulator layer in the remainder of the wider openings. The processing in items 702 and 706 is conducted so that the thermally conductive electrical insulator layer contacts and is between the electrical conductor and the insulator.

In some embodiments, the thermally conductive electrical insulator layer can be formed to contact a shallow trench isolation (STI) structure of the integrated circuit structure, where the thermally conductive electrical insulator layer is formed to contact and be positioned between the electrical conductor and the STI structure. The thermally conductive electrical insulator layer can also be formed to occupy at least 20% of the volume of the opening. Also, in some structures, the opening can be formed as a linear opening, circular opening, etc. The formation of the thermally conductive electrical insulator layer and the electrical conductor can be performed to form many different structures including a through silicon via (TSV), an electrically conductive wire, an external contact, an internal contact, an inter-layer electrical via, etc.

Figure 8:
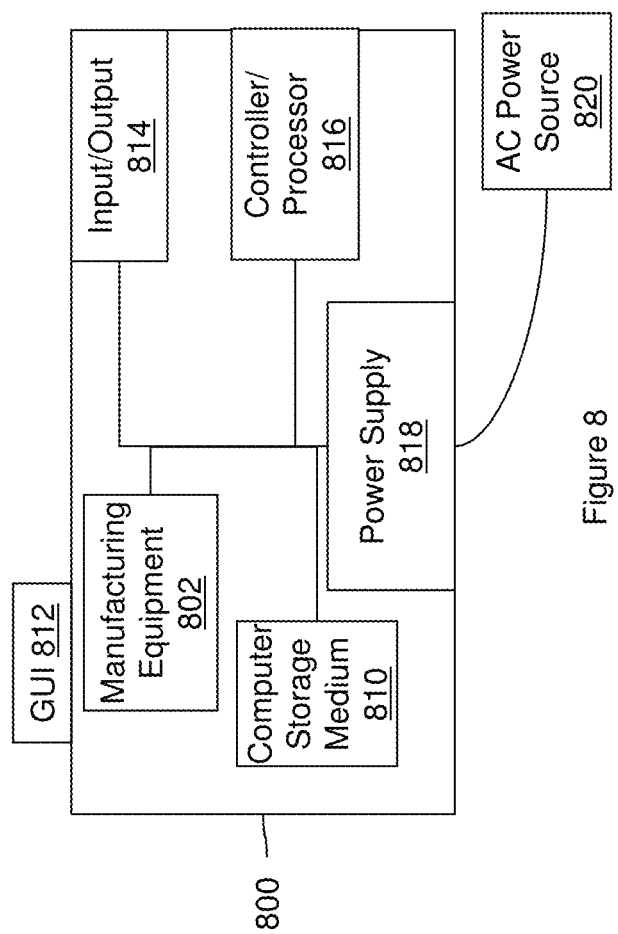
FIG. 8 is a schematic diagram of a system according to embodiments herein.

Additionally, as shown in FIG. 8, various manufacturing systems 800 herein include, among other components, at least one electronic storage 810 that maintains the original integrated circuit (IC) design, IC manufacturing equipment 802, a graphic user interface (GUI) 812, an input/output 814 that could be connected to an external network, a controller/processor 816, a power supply 818 that is connected to some external power source 820, etc. With these systems 800 a processor 816 is operatively connected to the electronic storage 810.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, a "semiconductor" is a material or structure that may include an implanted impurity that allows the material to sometimes be a conductor and sometimes be an insulator, based on electron and hole carrier concentration. Also, an "insulator" is a relative term that means a material or structure that allows substantially less (<95%) electrical current to flow than does a "conductor." The dielectrics (insulators) herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings herein, the same identification numeral identifies the same or similar item. The descriptions of the various embodiments herein have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
    an interconnect structure comprising an electrical conductor in an opening of an insulator, wherein the electrical conductor comprises a metal and electrically connects a first layer and a second layer on opposite sides of the insulator; and
    a thermally conductive electrical insulator liner along sidewalls of the opening and immediately adjacent to the electrical conductor.

2. The integrated circuit structure in claim 1, wherein the thermally conductive electrical insulator liner and the electrical conductor fill the opening, and wherein the thermally conductive electrical insulator liner contacts and is between the electrical conductor and the insulator.

3. The integrated circuit structure in claim 1, wherein the thermally conductive electrical insulator liner occupies at least 20% of a volume of the opening.

4. The integrated circuit structure of claim 1, further comprising a shallow trench isolation (STI) structure contacting the insulator, wherein the thermally conductive electrical insulator liner contacts and is positioned between the electrical conductor and the STI structure.

5. The integrated circuit structure of claim 1, wherein the interconnect structure comprises at least one of:
   a through silicon via (TSV);
   an electronically conductive wire;
   an external contact;
   an internal contact; and
   an inter-layer electrical via.

6. The integrated circuit structure in claim 1, wherein the opening comprises one of a linear and circular opening.

7. The integrated circuit structure in claim 1, wherein the thermally conductive electrical insulator liner comprises diamond, and wherein the electrical conductor comprises at least one of copper, tungsten, aluminum, and tin.

8. An integrated circuit structure comprising:
   an insulator layer;
   a first layer and a second layer on opposite sides of the insulator layer;
   an interconnect structure extending through the insulator layer between the first layer and the second layer,
   wherein the interconnect structure is in an opening extending through the insulator layer between the first layer and the second layer and comprises:
      an electrical conductor in the opening extending between the first layer and the second layer; and
      a thermally conductive electrical insulator liner along sidewalls of the opening extending between the first layer and the second layer,
      wherein the electrical conductor is positioned to conduct electrical signals between the first layer and the second layer, and
      wherein the thermally conductive electrical insulator liner is positioned to transfer heat between the first layer and the second layer; and
   a shallow trench isolation (STI) structure contacting the insulator layer, wherein the thermally conductive electrical insulator liner contacts and is positioned between the electrical conductor and the STI structure.

9. The integrated circuit structure in claim 8, wherein the thermally conductive electrical insulator liner and the electrical conductor fill the opening, and wherein the thermally conductive electrical insulator liner contacts and is between the electrical conductor and the insulator layer.

10. The integrated circuit structure in claim 8, wherein the thermally conductive electrical insulator liner occupies at least 20% of a volume of the opening.

11. The integrated circuit structure in claim 8, further comprising a-a semiconductor substrate, wherein the interconnect structure extends through the STI structure and the semiconductor substrate to a conductor layer on a bottom surface of the semiconductor substrate.

12. The integrated circuit structure in claim 8, wherein the interconnect structure comprises a through silicon via (TSV).

13. The integrated circuit structure in claim 8, wherein the opening comprises one of a linear and circular opening.

14. The integrated circuit structure in claim 8, wherein the thermally conductive electrical insulator liner comprises diamond, and wherein the electrical conductor comprises at least one of copper, tungsten, aluminum, and tin.

* * * * *